(12) United States Patent
Shinde et al.

(10) Patent No.: US 11,101,646 B2
(45) Date of Patent: Aug. 24, 2021

(54) CIRCUIT BREAKER SYSTEM WITH AN INTERNAL VOLTAGE LIMITER

(71) Applicant: ABB Power Grids Switzerland AG, Baden (CH)

(72) Inventors: Sushil A. Shinde, Monroeville, PA (US); Carl Kurinko, North Huntingdon, PA (US); Arnold P. Vitols, Delmont, PA (US); Gary Hammack, Greensburg, PA (US); Thomas Hoburn, Mount Pleasant, PA (US); Peter Dubach, Aargau (CH); Ektor Sotiropoulos, Zürich (CH)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 154 days.

(21) Appl. No.: 16/458,705

(22) Filed: Jul. 1, 2019

(65) Prior Publication Data
US 2019/0326748 A1    Oct. 24, 2019

Related U.S. Application Data

(63) Continuation of application No. PCT/US2017/068733, filed on Dec. 28, 2017.
(Continued)

(51) Int. Cl.
*H02H 9/04* (2006.01)
*G01R 31/327* (2006.01)
(Continued)

(52) U.S. Cl.
CPC ........... *H02H 9/042* (2013.01); *G01R 31/327* (2013.01); *G05F 1/10* (2013.01); *H01H 33/02* (2013.01);
(Continued)

(58) Field of Classification Search
CPC .......... H02H 9/041; H02H 9/042; H02H 1/06; H02H 3/08; G01R 31/327; G01R 15/20;
(Continued)

(56) References Cited

U.S. PATENT DOCUMENTS

| 4,425,596 A | * | 1/1984 | Satou | G01R 15/202 |
| | | | | 361/93.6 |
| 4,816,958 A | * | 3/1989 | Belbel | H01H 33/161 |
| | | | | 361/93.7 |

(Continued)

FOREIGN PATENT DOCUMENTS

| CN | 1165385 A | 11/1997 |
| CN | 102694363 A | 9/2012 |

(Continued)

OTHER PUBLICATIONS

Kieffel et al. (Alternative Gas to SF6 for Use in High Voltage Switchgears. 23rd International Conference on Electricity Distribution. Jun. 18, 2015). Jun. 18, 2015.*

(Continued)

*Primary Examiner* — Yemane Mehari
(74) *Attorney, Agent, or Firm* — Sage Patent Group

(57) ABSTRACT

A circuit breaker system is disclosed in the present application. The circuit breaker system includes a housing to hold an electrical interrupter within an internal region separated from an external ambient region. The electrical interrupter includes at least a first pair of electrical contact elements that are movable between open and closed positions. A voltage limiter, such as a metal oxide varistor (MOV), is connected across the pair of electrical contact elements to receive and dissipate a transient voltage when the first pair of electrical contacts is moved from a closed position to an open position, thereby reducing undesired arcing and premature wear or erosion of certain electrical components.

26 Claims, 4 Drawing Sheets

Related U.S. Application Data

(60) Provisional application No. 62/441,229, filed on Dec. 31, 2016.

(51) Int. Cl.
  *G05F 1/10* (2006.01)
  *H01H 33/02* (2006.01)
  *H01H 83/00* (2006.01)
  *H02H 1/06* (2006.01)
  *H02H 3/08* (2006.01)

(52) U.S. Cl.
  CPC .............. *H01H 83/00* (2013.01); *H02H 1/06* (2013.01); *H02H 3/08* (2013.01); *H02H 9/041* (2013.01)

(58) Field of Classification Search
  CPC .......... G05F 1/10; H01H 33/02; H01H 83/00; H01B 17/42
  USPC ........................................................ 361/118
  See application file for complete search history.

(56) References Cited

U.S. PATENT DOCUMENTS

| | | |
|---|---|---|
| 5,262,605 A | 11/1993 | Pham et al. |
| 5,814,782 A | 9/1998 | Mueller |
| 6,477,025 B1 * | 11/2002 | Goldbach .............. H02H 9/042 337/159 |
| 2006/0098932 A1 * | 5/2006 | Battey .................. G02B 6/3897 385/135 |
| 2008/0174926 A1 * | 7/2008 | Evans .................... H02H 9/001 361/90 |
| 2011/0136353 A1 * | 6/2011 | Spitaels .................. H01B 7/30 439/95 |
| 2015/0364285 A1 | 12/2015 | Shinde et al. |

FOREIGN PATENT DOCUMENTS

| | | |
|---|---|---|
| CN | 106165048 A | 11/2016 |
| EP | 2848951 A1 | 3/2015 |
| WO | WO 2015/010916 A1 | 1/2015 |

OTHER PUBLICATIONS

International Bureau of WIPO, International Preliminary Report on Patentability issued in corresponding Application No. PCT/US2017/068733, dated Jul. 11, 2019, 10 pp.

International Searching Authority / US, International Search Report & Written Opinion issued in corresponding Application No. PCT/US2017/068733, dated Mar. 20, 2018, 16 pp.

Kieffel et al., "Alternative Gas to SF6 for Use in High Voltage Switchgears: g3," 23rd International Conference on Electricity Distribution, Jun. 15-18, 2015, 5 pp.

First Office Action, Chinese Application No. 201780087626.2, dated Dec. 3, 2020, 4 pages.

* cited by examiner

CIRCUIT BREAKER SYSTEM WITH AN INTERNAL VOLTAGE LIMITER

TECHNICAL FIELD

The present application generally relates to a circuit breaker system and more particularly, but not exclusively, to a circuit breaker system with an internal voltage limiter, such as a varistor, a surge arrestor, or a metal oxide varistor (MOV), connected across the switching contacts to control overvoltage and re-ignition or restrikes.

BACKGROUND

Circuit breakers are commonly found in substations and are operable to selectively open and close electrical connections. Typical dead tank circuit breakers have pole assemblies that include first and second electrical conductors in associated bushings. As is known in the art, electrical power lines are coupled to first and second electrical conductors, and the circuit breaker selectively opens or closes the electrical connection there-between. Electrical interrupters which are part of the circuit breaker operate to interrupt electrical current by separating one conductor from another a distance sufficient to prevent electrical arcing between the conductors. As an electrical contact of an interrupter is moved from a closed position to an open position, an overvoltage can occur and cause arcing and premature wear on surfaces of electrical contacts. Reactor de-energizing is a severe switching duty for any high voltage circuit breaker. The reactors are used for compensation purposes and are switched almost daily. Reactor de-energizing can cause over voltages and re-ignitions and thus a thermal/dielectric failure of an interrupter. Re-ignitions have the potential to be catastrophic to the breaker if current starts flowing again. Some existing systems have various shortcomings relative to certain applications. Accordingly, there remains a need for further contributions in this area of technology.

SUMMARY

One embodiment of the present application is a unique circuit breaker system with internal overvoltage protection. Other embodiments include apparatuses, systems, devices, hardware, methods, and combinations for a circuit breaker system with an electrical interrupter having a voltage limiter, such as a varistor, a surge arrestor or metal oxide varistor (MOV), for overvoltage protection. Further embodiments, forms, features, aspects, benefits, and advantages of the present application shall become apparent from the description and figures provided herewith.

DETAILED DESCRIPTION OF THE ILLUSTRATIVE EMBODIMENTS

Figure 1A:
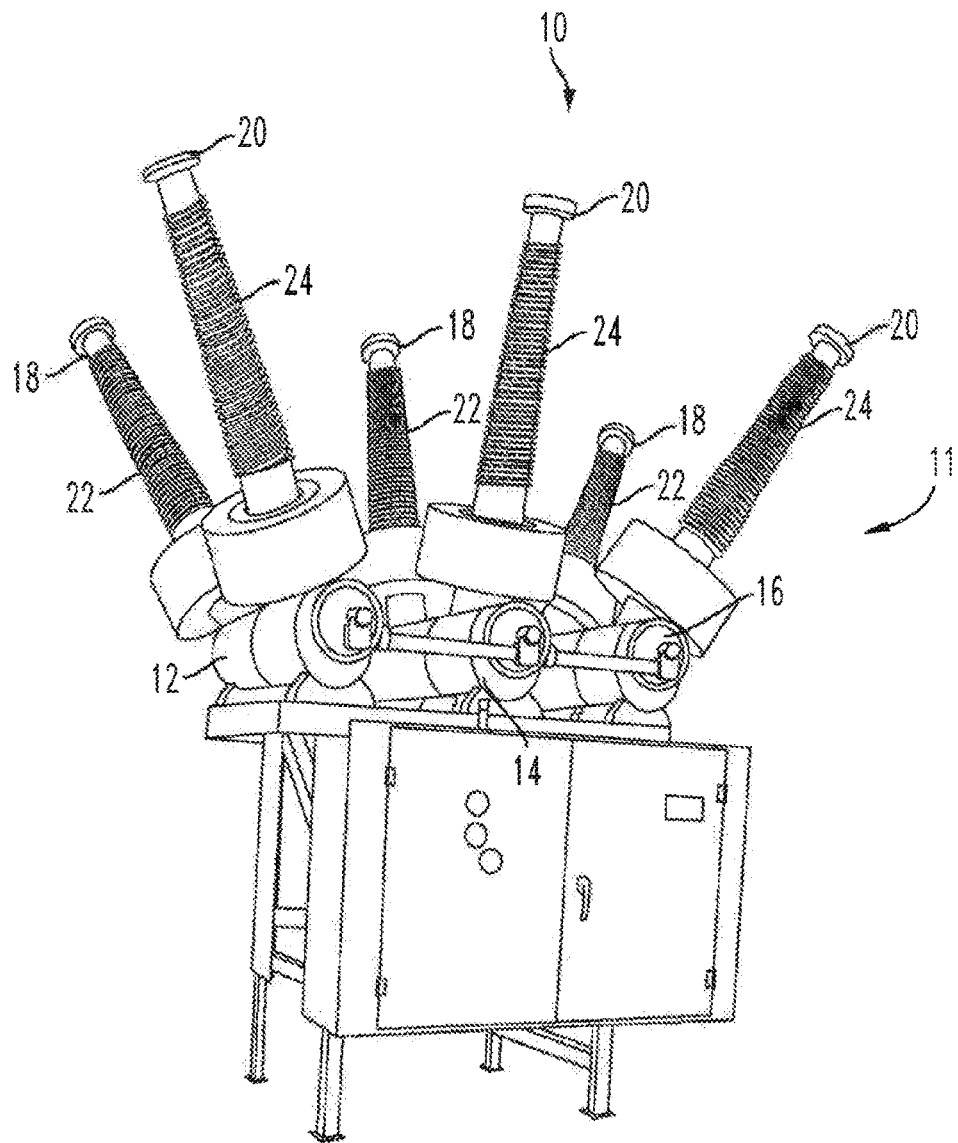
FIGS. 1A and 1B are perspective views of circuit breaker systems according to exemplary illustrative embodiments of the present disclosure.

For the purposes of promoting an understanding of the principles of the application, reference will now be made to the embodiments illustrated in the drawings and specific language will be used to describe the same. It will nevertheless be understood that no limitation of the scope of the application is thereby intended. Any alterations and further modifications in the described embodiments, and any further applications of the principles of the application as described herein are contemplated as would normally occur to one skilled in the art to which the application relates.

Figure 1B:
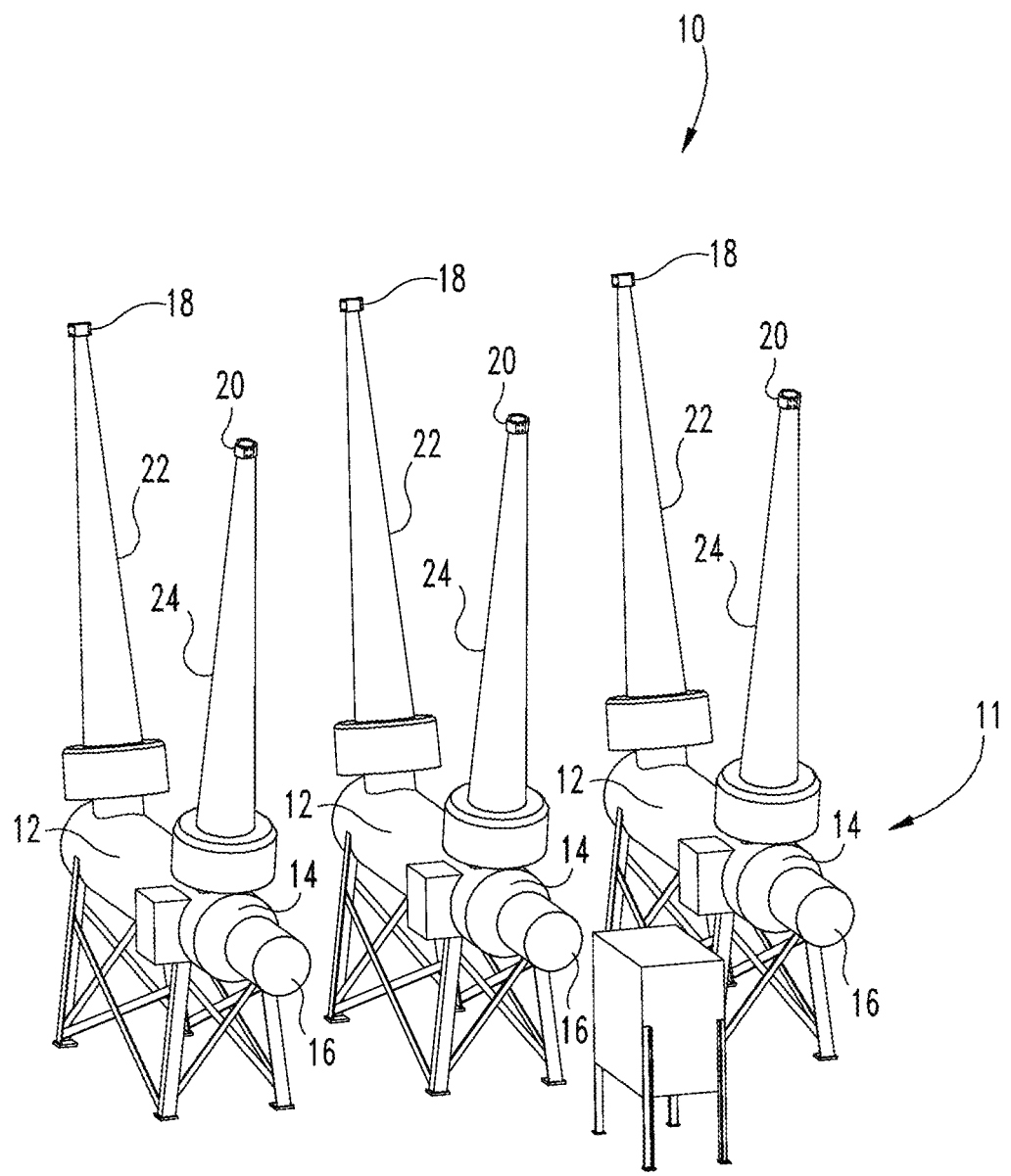

Referring to FIGS. 1A and 1B, exemplary circuit breaker systems with three circuit breaker poles mounted on a common frame and mounted separately are illustrated respectively. Other types of circuit breakers are contemplated by the present disclosure. The circuit breaker system 10, including an interrupter system 11 is operable to permit electrical current to selectively flow therethough in a first configuration and prevent electrical current from flowing in a second configuration. In this manner, a portion of an electrical system such as a high tension wiring system component in a power station or the like, may be isolated from a source of electrical power so that maintenance procedures may be safely performed thereon. Electrical interrupters 11 operate by moving a portion of an electrical conductor such that an inlet conductor portion is separated from an outlet conductor portion by a gap or space that is of a sufficient distance to prevent electrical arcing from the inlet portion to the outlet portion.

In one form, the circuit breaker system 10 can include a three phase circuit breaker system as illustrated. The circuit breaker system 10 in a three phase form can include three pole assemblies 12, 14 and 16 respectively. In other forms, the circuit breaker system 10 can include a different number of poles. In some forms the pole assemblies can be operated by one actuator system and in other forms the pole assemblies can be operated by separate actuator systems. Each pole assembly 12, 14 and 16 can include a first electrical terminal 18 and a second electrical terminal 20. Each of the first and second electrical terminals 18, 20 can include insulating bushings 22 and 24 positioned externally around conductors (not shown). Electrical power lines (not shown) are coupled to the first and second electrical terminals 18, 20 and the circuit breaker selectively opens or closes the electrical connection there-between. The first and second electrical terminals 18, 20 are in electrical communication via an electrical circuit with one another in a first configuration when the interrupter 11 of the circuit breaker system 10 is closed and are electrically isolated from one another in a second configuration when the interrupter 11 of the circuit breaker system 10 is open. The interrupter 11 of the circuit breaker system 10 for each pole assembly selectively opens or closes the electrical connection between the first and second electrical terminals 18, 20 via an actuation system 14 in a manner that would be known to one skilled in the art.

Figure 2:
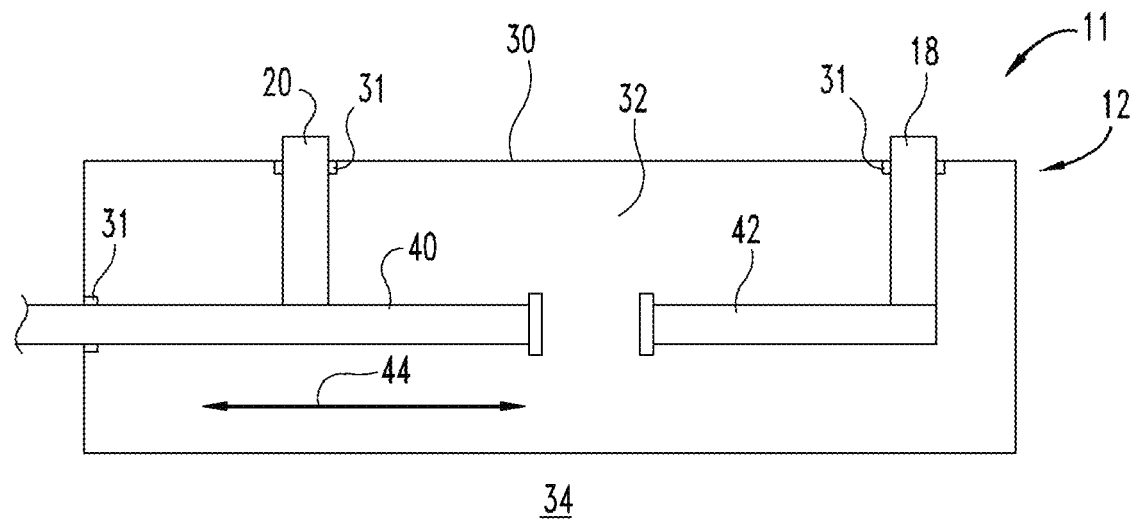
FIG. 2 is cross-sectional schematic view of a portion of an electrical interrupter for the circuit breaker system of FIG. 1.

Referring now to FIG. 2, an exemplary view of an interior portion of a high voltage pole assembly in a circuit breaker system 10 with a simplified illustration of an electrical interrupter 11 is shown. A housing 30 includes an interior space 32 that is isolated from an external ambient space 34. In one form the housing 30 defines a dead tank (e.g. electrically isolated or dead potential from electric power), while in other forms the housing can define a live tank (e.g. electrically conducting or live potential). The interior space 32 may include a dielectric medium. The dielectric medium can include gases or liquids, such as by way of example and not limitation SF6 (sulfur hexafluoride), dry ambient air, dry N2 (nitrogen), $CO_2$ (carbon dioxide), oil, or the like. Alternatively, a vacuum interrupter could be employed within the interior space 32 surrounded by dielectric materials as desired. The housing 30 may include one or more seals 31 between certain components projecting from the interior to the exterior of the housing 30 to isolate the interior space 32 from external ambient space 34.

A portion of an exemplary pole assembly 12 includes a first electrical terminal 18 electrically connected to a first element 42 which may be stationary contact secured within the pole assembly 12. A second electrical terminal 20 is electrically connected to a second element 40 which may be a movable contact carried within pole assembly 12 in a manner allowing movement therein. Thus, in a first position, the movable contact element 40 may be positioned to break the electrical connection between the first electrical terminal 18 and the second electrical terminal 20. In a second position, the movable contact element 40 may be brought into contact with stationary contact element 42 to electrically connect the first electrical terminal 18 and the second electrical terminal 20. As discussed above, the interior space 32 of pole assembly 12 is sealed and generally adapted to minimize arcing between the stationary contact element 42 and movable contact element 40 when in an open position. The movable contact element 40 can generally move in opposing directions illustrated by double arrow 44. While horizontal movement is depicted in the schematic illustrations, it should be understood that other orientations and forms of movement may be employed such as a pivot contact switch or the like. Further, in some forms, the second electrical contact element 42 may be movable in addition to or in lieu of a movable first electrical contact element 40.

Figure 3:
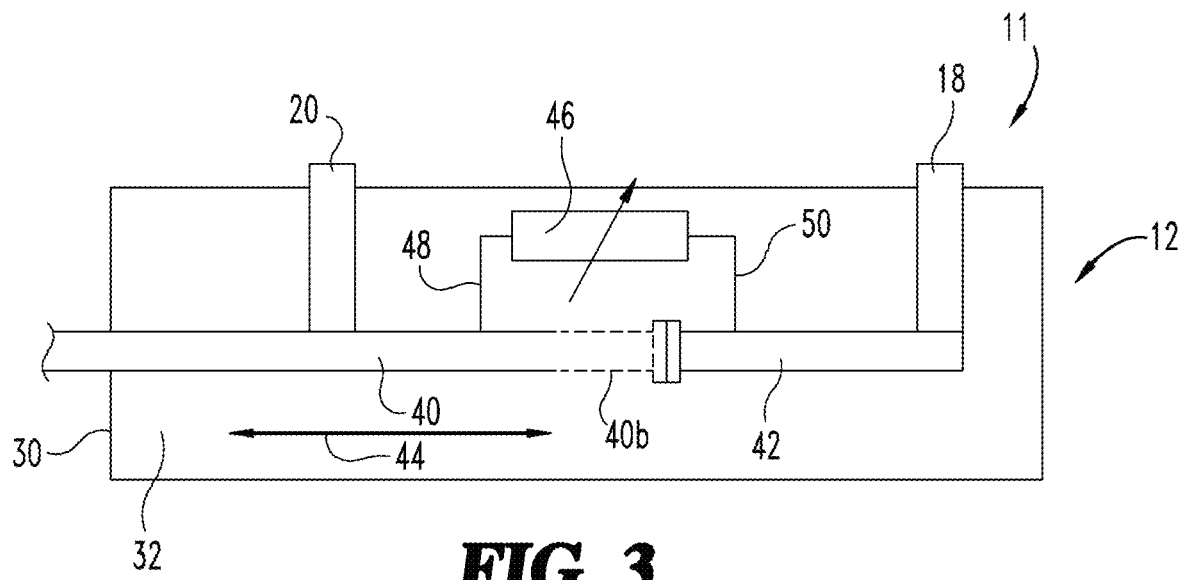
FIG. 3 is cross-sectional schematic view of one embodiment of an electrical interrupter with a voltage limiter in electrical communication with a pair of movable contacts for the circuit breaker system of FIG. 1.

Referring now FIG. 3, a cross-sectional schematic view of an embodiment of an electrical interrupter 11 with a voltage limiter such as a metal oxide varistor (MOV) 46 is shown therein. A varistor is a voltage-dependent, nonlinear resistor that changes its resistance value automatically with the change in voltage. An MOV is a passive unit consisting of metal-oxide resistors direct molded in a silicone housing or polyester insulating tube that can be used to provide surge protection in the electrical network. MOVs can be formed of an encapsulated polycrystalline ceramic body including metal oxides with electrodes positioned at either end connected to wire leads. Typical metal oxide materials and can include zinc oxide and bismuth oxide. However, other constructions and metal oxides are contemplated herein and should be understood to be within the scope of this disclosure.

In the configuration shown in FIG. 3, the MOV 46 absorbs transient voltage or overvoltage that occurs when the contact elements 40, 42 are separated from one another. Separation occurs when the contact elements 40, 42 are moved from a closed connection as illustrated by dash line 40b to an open position illustrated in FIG. 2 when the contact element 40 is moved in a direction toward the left defined by double arrow 44. In one form, a high voltage current enters through one of the electrical terminals 18 or 20 and directs the flow of electricity to the other of the electrical terminals 18 or 20 when the contact elements 40 and 42 are in a connected position. When the contact element 40 is moved to the open position, a transient voltage or overvoltage spike can be transmitted through one or both of a first electrical connection 48 and a second electrical connection 50 that are in electrical communication with an MOV 46. In this form, the MOV 46 is located in parallel across the first and the second electrical contact elements 40, 42. The MOV 46 is configured to absorb the transient overvoltage so as to prevent harmful arcing events during a circuit breaker opening operation. In this manner the reliability and durability of the contact elements 40, 42 can be increased.

Figure 4:
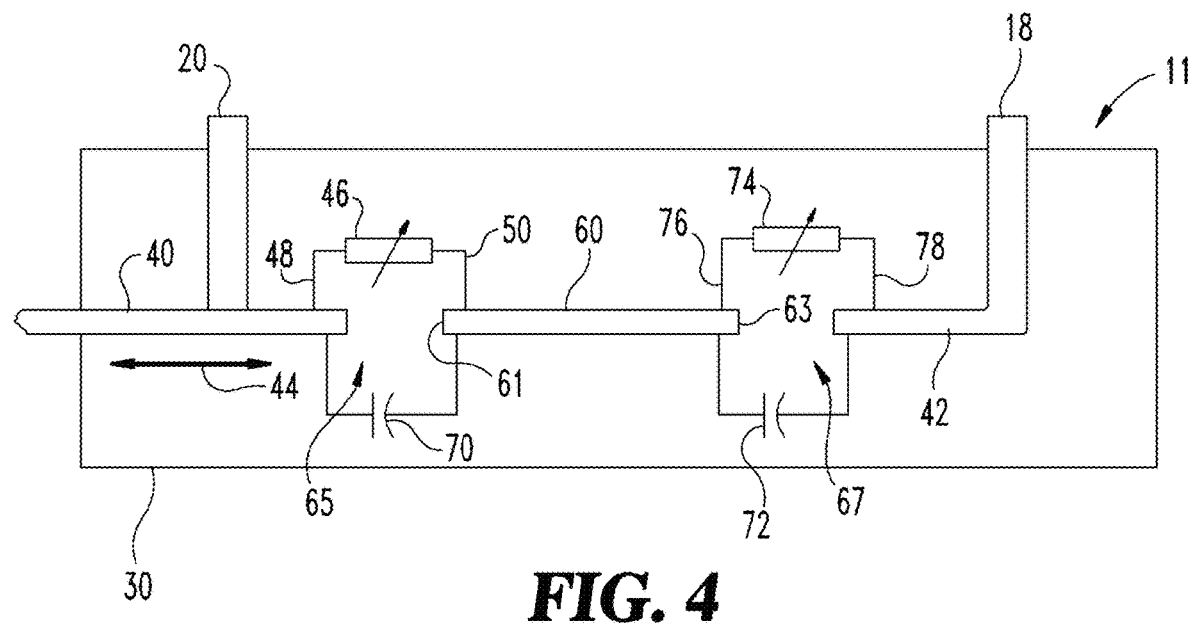
FIG. 4 is cross-sectional schematic view of another embodiment of an electrical interrupter with multiple voltage limiters in electrical communication with multiple pairs of movable contacts for the circuit breaker system of FIG. 1.

Referring now to FIG. 4, another embodiment of the present disclosure is illustrated by a cross-sectional schematic view of housing 30 with a pole assembly having multiple interrupter contact regions 65, 67 defined by corresponding pairs of contact elements and MOVs is illustrated. It should be understood that while two pairs of contact elements are depicted, additional pairs of contact elements are contemplated by this application. In this exemplary embodiment, a first contact element 40 may be separated (electrically isolated) or in contact (electrically connected) with operating rod 60 at first end 61 thereof. A second contact element 42 may be separated (electrically isolated) or in contact (electrically connected) with operating rod 60 at second end 63 thereof. A first MOV 46 can be constructed and arranged in parallel across a first contact region 65 by way of an electrical connection 48 and an electrical connection 50 that electrically connect the MOV 46 to the contact element 40 and the operating rod 60. In some forms a capacitor such as a grading capacitor 70 can be connected in parallel with the MOV 46 across the first contact region 65.

A second contact region 67 can be constructed in series with the first contact region 65. The second contact region 67 can include a second MOV 74 that can be, in some forms, connected in parallel with a second grading capacitor 72 extending across the second contact region 67. The second MOV 74 can be connected in the circuit in similar fashion to that of the first MOV 46. An electrical connection 76 can connect a second or opposing end 63 of the operating rod 60 to the second MOV 74 and an electrical connection 78 can connect the second MOV 74 to the second electrical contact element 42. The second grading capacitor 72 can be connected in parallel with the second MOV 74 across the second contact region 67 in some embodiments. The grading capacitors 70, 72 are constructed to ensure an equal voltage potential occurs between the contact elements 40, 60, and 42, 60 of the first and second contact regions 65, 67, respectively. Two contact regions are typically connected in series as shown in FIG. 4 to achieve higher transient recovery voltage and overvoltage protection. Without the grading capacitors 70, 72, the overvoltage may not be evenly distributed across the contact regions 65, 67 causing voltage stress on the respective interrupter contacts which can lead to dielectric breakdown or contact surface erosion and the like. The first MOV 46 and the second MOV 74 absorb the transient voltage or overvoltage that occurs when the contact elements across the first and second contact regions 65, 67 are moved to an open position and thus prevent undesired electrical arcing in the first and second contact regions 65, 67. In this manner the premature wear and operability problems of certain portions of the interrupter 11 can be minimized or eliminated entirely.

Figure 5:
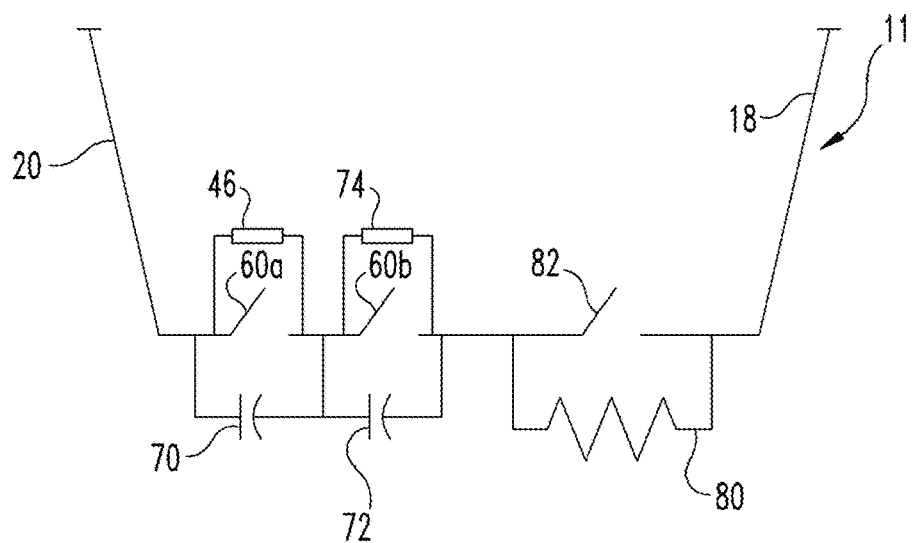
FIG. 5 is a schematic view of a portion of an electrical interrupter with a closing resistor and bypass switch for the circuit breaker system.

Referring now to FIG. 5, another embodiment of the present disclosure is illustrated in a schematic view of a portion of an electrical interrupter 11 with multiple contact regions 65, 67, multiple MOVs 46, 74 and multiple grading capacitors 70, 72 connected in series with a closing resistor 80. Each of the contact regions 65, 70 can include an electrical switch 60*a* and 60*b* respectively. The electrical switches 60*a* and 60*b* are shown in schematic form and may take any form to provide open and closed contact regions 65, 67. In some forms a bypass switch 82 can be constructed in parallel across the closing resistor 80 between the first electrical terminal 18 and the second electrical terminal 20. The closing resistor 80 is operable for reducing voltage transients that generally occur when contact elements move from an open position to a closed position. For example, a voltage transient may occur when a low transmission line is energized or reenergized after a line fault. The bypass switch 82 of the closing resistor 80 can be operated by the same mechanism as contact switches 60*a* and 60*b* and can be opened or closed depending on operation of the interrupter 11. The grading capacitors 70, 72 and MOVs 46, 74 operate in this configuration in similar fashion that shown in the embodiment of FIG. 4. In this manner, transient voltages may be evenly distributed and absorbed across multiple contact regions 65, 67 in an interrupter 11 in order to avoid high voltage stresses on portions of the system.

In one aspect the present disclosure includes a circuit breaker comprising a housing defining an internal space; a first electrical line terminal at least partially positioned within the internal space; a second electrical line terminal at least partially positioned within the internal space; a first electrical contact element in electrical communication with the first electrical line terminal; a second electrical contact element in electrical communication with the second electrical line terminal; an actuator operable to move at least one of the first and second electrical contact elements between a connected position and a disconnected position, wherein the connected position permits electrical communication between the first and second line terminals and the disconnected position restricts electrical communication between the first and second line terminals; and a voltage limiter positioned within the housing, the voltage limiter structured to be in electrical communication with the first and second electrical contact elements.

In refining aspects the circuit breaker further comprises a capacitor in electrical communication with the first and second electrical contact elements; the capacitor and the voltage limiter are connected in parallel with the first and second electrical contact elements; third and fourth contact elements located within the housing in series with the first and second contact elements; a second voltage limiter and a second capacitor connected in parallel with the third and fourth contact elements; a closing resistor located in series with the first and second electrical contact elements; a bypass switch connected in parallel with the closing resistor; the housing is a dead tank construction including one or more seals to fluidly isolate the internal space from an external ambient space; a dielectric material located within the internal space of the housing; wherein the dielectric material includes sulfur hexafluoride (SF6), dry air, dry nitrogen (N2), carbon dioxide ($CO_2$), oil, and/or a vacuum.

Another aspect of the present disclosure includes a method for absorbing transient over voltages in a circuit breaker comprising moving a first pair of first and second electrical contact elements from a closed position to an open position, wherein the closed position defines electrical connection between first and second electrical line terminals and the open position defines an electrical isolation of the first electrical line terminal from the second electrical line terminal; directing a transient voltage generated during the opening of the electrical contact elements to a first voltage limiter; wherein the first voltage limiter and the first and second electrical contact elements are located in parallel within a housing that includes an internal region that is isolated from an ambient external region.

In refining aspects, the method further comprises moving a second pair of third and fourth contact elements from a closed position to an open position, wherein the closed position defines an electrical connection between the first and second electrical line terminals and the open position defines an electrical isolation of the first electrical line terminal from the second electrical line terminal; directing a transient voltage generated during the opening of the third and fourth electrical contact elements to a second voltage limiter; wherein the second voltage limiter and the third and fourth electrical contact elements are located in parallel within the housing between the first and second line terminals; dissipating the transient voltage with the first and second voltage limiters when the first and second pairs of electrical contacts are moved from a closed to an open position; distributing relative equal voltage across the first and second pair of contact elements during an opening procedure with a first and a second grading capacitor positioned in parallel with the first and second voltage limiters, respectively between the first and second line terminals; absorbing transient voltage with a closing resistor positioned in series with the first and second contact elements during a closing procedure; selectively by passing the closing resistor with a bypass switch positioned in parallel with the closing resistor; reducing undesired electrical arcing within the housing with a dielectric material positioned within the housing, wherein the dielectric material includes at least one of sulfur hexafluoride (SF6), dry air, dry nitrogen (N2), carbon dioxide ($CO_2$), oil, or a vacuum.

Another aspect of the present disclosure includes an apparatus comprises a circuit breaker having a housing with an internal region separated from an ambient region surrounding the housing; an electrical interrupter having a first pair of first and second electrical contacts that are movable between a first position and a second position, the first position defining a connected position that permits electrical communication between the first pair of contacts and the second position defining a separated position that prevents electrical communication between the first pair of electrical contacts; a varistor connected across the first pair of electrical contacts to receive and dissipate a transient voltage when the first pair of electrical contacts are moved from the first position to the second position; wherein the internal region of the housing is configured to hold the first pair of electrical contacts, the varistor and a dielectric material.

In refining aspects, the voltage limiter is a metal oxide varistor (MOV); the varistor and the first pair electrical contacts are connected in parallel between first and second electrical terminals; the varistor is configured to dissipate overvoltage transients when the first pair of electrical contacts are moved from the first position to the second position; a capacitor connected in parallel with the varistor across the first pair of electrical contacts; a second pair of third and fourth electrical contact elements constructed in series with the first pair of contact elements; a second varistor connected in parallel across the second pair of electrical contacts; a second capacitor connected in parallel with the second varistor across the second pair of electrical contacts; a closing resistor connected in series with the varistor and the first pair of electrical contacts; a bypass switch connected in parallel with the closing resistor.

While the application has been illustrated and described in detail in the drawings and foregoing description, the same is to be considered as illustrative and not restrictive in character, it being understood that only the preferred embodiments have been shown and described and that all changes and modifications that come within the spirit of the applications are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the application, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A circuit breaker comprising:
   a housing defining an internal space;
   a first electrical line terminal at least partially positioned within the internal space;
   a second electrical line terminal at least partially positioned within the internal space;
   a first electrical contact element in electrical communication with the first electrical line terminal;
   a second electrical contact element in electrical communication with the second electrical line terminal;
   an actuator operable to move the first electrical contact element in a first linear direction that is towards the second electrical contact element to a connected position and in a second direction that is away from the second electrical contact element and is opposite the first linear direction to a disconnected position, wherein the connected position permits electrical communication between the first and second line terminals and the disconnected position restricts electrical communication between the first and second line terminals; and
   a voltage limiter positioned within the housing, the voltage limiter structured to be in electrical communication with the first and second electrical contact elements.

2. The circuit breaker of claim 1, further comprising a capacitor in electrical communication with the first and second electrical contact elements.

3. The circuit breaker of claim 2, wherein the voltage limiter and the capacitor are connected in parallel with the first and second electrical contact elements.

4. The circuit breaker of claim 2 further comprising third and fourth contact elements located within the housing in series with the first and second contact elements.

5. The circuit breaker of claim 4 further comprising a second voltage limiter and a second capacitor connected in parallel with the third and fourth contact elements.

6. The circuit breaker of claim 1 further comprising a closing resistor located in series with the first and second electrical contact elements.

7. The circuit breaker of claim 6 further comprising a bypass switch connected in parallel with the closing resistor.

8. The circuit breaker of claim 1, wherein the housing is a dead tank construction including one or more seals to fluidly isolate the internal space from an external ambient space.

9. The circuit breaker of claim 8 further comprising a dielectric material located within the internal space of the housing.

10. The circuit breaker of claim 9, wherein the dielectric material includes sulfur hexafluoride (SF6), dry air, dry nitrogen (N2), carbon dioxide (CO.sub.2), oil, and/or a vacuum.

11. A method for absorbing transient over voltages in a circuit breaker comprising:
    moving a first pair of first and second electrical contact elements from a closed position to an open position, wherein the closed position defines electrical connection between first and second electrical line terminals and the open position defines an electrical isolation of the first electrical line terminal from the second electrical line terminal;
    directing a transient voltage generated during the opening of the electrical contact elements to a first voltage limiter; and
    wherein the first voltage limiter and the first and second electrical contact elements are located in parallel within a housing that includes an internal region that is isolated from an ambient external region.

12. The method of claim 11 further comprising:
    moving a second pair of third and fourth contact elements from a closed position to an open position, wherein the closed position defines an electrical connection between the first and second electrical line terminals and the open position defines an electrical isolation of the first electrical line terminal from the second electrical line terminal;
    directing a transient voltage generated during the opening of the third and fourth electrical contact elements to a second voltage limiter;
    wherein the second voltage limiter and the third and fourth electrical contact elements are located in parallel within the housing between the first and second line terminals.

13. The method of claim 12 further comprising dissipating the transient voltage with the first and second voltage limiters when the first and second pairs of electrical contacts are moved from a closed to an open position.

14. The method of claim 12 further comprising distributing relative equal voltage across the first and second pair of contact elements during an opening procedure with a first and a second grading capacitor positioned in parallel with the first and second voltage limiters, respectively between the first and second line terminals.

15. The method of claim 11 further comprising absorbing transient voltage with a closing resistor positioned in series with the first and second contact elements during a closing procedure.

16. The method of claim 15 further comprising selectively by passing the closing resistor with a bypass switch positioned in parallel with the closing resistor.

17. The method of claim 16 further comprising reducing undesired electrical arcing within the housing with a dielectric material positioned within the housing, wherein the dielectric material includes at least one of sulfur hexafluoride (SF6), dry air, dry nitrogen (N2), carbon dioxide (CO.sub.2), oil, or a vacuum.

18. An apparatus comprising:
a circuit breaker having a housing with an internal region separated from an ambient region surrounding the housing;
an electrical interrupter having a first pair of first and second electrical contacts that are movable between a first position and a second position, the first position defining a connected position that permits electrical communication between the first pair of contacts and the second position defining a separated position that prevents electrical communication between the first pair of electrical contacts;
a voltage limiter connected across the first pair of electrical contacts to receive and dissipate a transient voltage when the first pair of electrical contacts is moved from the first position to the second position; and
wherein the internal region of the housing is configured to hold the first pair of electrical contacts, the voltage limiter and a dielectric material.

19. The apparatus of claim 18, wherein the voltage limiter is a metal oxide varistor (MOV).

20. The apparatus of claim 18, wherein the voltage limiter and the first pair electrical contacts are connected in parallel between first and second electrical terminals.

21. The apparatus of claim 18, wherein the voltage limiter is configured to dissipate overvoltage transients when the first pair of electrical contacts is moved from the first position to the second position.

22. The apparatus of claim 18 further comprising a capacitor connected in parallel with the voltage limiter across the first pair of electrical contacts.

23. The apparatus of claim 22 further comprising: a second pair of third and fourth electrical contact elements constructed in series with the first pair of contact elements; and a second voltage limiter connected in parallel across the second pair of electrical contacts.

24. The apparatus of claim 23 further comprising a second capacitor connected in parallel with the second voltage limiter across the second pair of electrical contacts.

25. The apparatus of claim 18 further comprising a closing resistor connected in series with the voltage limiter and the first pair of electrical contacts.

26. The apparatus of claim 25 further comprising a bypass switch connected in parallel with the closing resistor.

* * * * *